United States Patent
Engl et al.

(10) Patent No.: US 9,105,823 B2
(45) Date of Patent: Aug. 11, 2015

(54) OPTOELECTRONIC SEMICONDUCTOR CHIP AND METHOD FOR PRODUCING AN OPTOELECTRONIC SEMICONDUCTOR CHIP

(75) Inventors: Karl Engl, Pentling (DE); Johann Eibl, Wald (DE); Tamas Lamfalusi, Regensburg (DE); Markus Maute, Alteglofsheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/983,972

(22) PCT Filed: Jan. 18, 2012

(86) PCT No.: PCT/EP2012/050713
§ 371 (c)(1),
(2), (4) Date: Oct. 14, 2013

(87) PCT Pub. No.: WO2012/107261
PCT Pub. Date: Aug. 16, 2012

(65) Prior Publication Data
US 2014/0027805 A1    Jan. 30, 2014

(30) Foreign Application Priority Data
Feb. 7, 2011   (DE) .................. 10 2011 003 684

(51) Int. Cl.
H01L 33/00  (2010.01)
H01L 33/58  (2010.01)
H01L 33/38  (2010.01)
H01L 33/20  (2010.01)
H01L 33/32  (2010.01)

(52) U.S. Cl.
CPC ................ *H01L 33/58* (2013.01); *H01L 33/20* (2013.01); *H01L 33/382* (2013.01); *H01L 33/32* (2013.01); *H01L 2924/0002* (2013.01)

(58) Field of Classification Search
CPC ......... H01L 33/08; H01L 33/20; H01L 33/22; H01L 33/26; H01L 33/382
USPC .................................... 257/92–100
See application file for complete search history.

(56) References Cited

U.S. PATENT DOCUMENTS

| | | |
|---|---|---|
| 2006/0204865 A1 | 9/2006 | Erchak et al. |
| 2009/0152578 A1 | 6/2009 | Lee |
| 2009/0159908 A1 | 6/2009 | David et al. |
| 2011/0049555 A1* | 3/2011 | Engl et al. ................ 257/98 |
| 2012/0025246 A1* | 2/2012 | Kim et al. ................ 257/98 |

FOREIGN PATENT DOCUMENTS

| | | |
|---|---|---|
| DE | 102007003282 A1 | 7/2008 |
| DE | 102007022947 A1 | 10/2008 |
| DE | 102008062933 A1 | 7/2010 |
| DE | 102009018286 A1 | 10/2010 |
| WO | 2010020069 A1 | 2/2010 |

* cited by examiner

*Primary Examiner* — Brook Kebede
(74) *Attorney, Agent, or Firm* — Slater & Matsil, L.L.P.

(57) ABSTRACT

An optoelectronic semiconductor chip has an epitaxial layer sequence. A doped epitaxial layer of the epitaxial layer sequence has a first region and a second region and a protected structure. The first region of the doped epitaxial layer completely covers the protected structure. The outer surface of the doped epitaxial layer has a first roughness in the first region and a second roughness in the second region.

22 Claims, 11 Drawing Sheets

OPTOELECTRONIC SEMICONDUCTOR CHIP AND METHOD FOR PRODUCING AN OPTOELECTRONIC SEMICONDUCTOR CHIP

This patent application is a national phase filing under section 371 of PCT/EP2012/050713, filed Jan. 18, 2012, which claims the priority of German patent application 10 2011 003 684.9, filed Feb. 7, 2011, each of which is incorporated herein by reference in its entirety.

TECHNICAL FIELD

The present invention relates to an optoelectronic semiconductor chip and a method for producing an optoelectronic semiconductor chip.

BACKGROUND

Optoelectronic semiconductor chips can emit electromagnetic radiation. Optoelectronic semiconductor chips comprise an epitaxial layer sequence. The epitaxial layer sequence can comprise a doped epitaxial layer. The electromagnetic radiation can be coupled out from the optoelectronic semiconductor chip via an outer surface of the doped epitaxial layer. The outer surface of the doped epitaxial layer can be roughened. The roughened surface can comprise a pyramid structure. The pyramid structure is necessary or advantageous for increasing the coupling-out efficiency for electromagnetic radiation from the optoelectronic semiconductor chip. Electrical contact can be made with the doped epitaxial layer of the epitaxial layer sequence by means of so-called contact recesses. For the electrical conductivity, the contact recesses comprise silver, for example. The contact recesses at least partly traverse the epitaxial layer sequence from the side of the epitaxial layer sequence facing away from the doped epitaxial layer. As a result of the necessary roughening of the outer surface of the doped epitaxial layer, the doped epitaxial layer is thinned. Above the contact recesses, the doped epitaxial layer can be thinned to such a great extent that the contact recesses are at least partly exposed. The silver is thus also exposed. The optoelectronic semiconductor chip becomes unusable as a result of exposed contact recesses. The exposed silver of the contact recesses is discernible during the general optical inspection of the semiconductor chip.

SUMMARY OF THE INVENTION

Embodiments of the invention specify an optoelectronic semiconductor chip in which structures such as the contact recesses are protected even after roughening and at the same time electromagnetic radiation can be coupled out efficiently.

BRIEF DESCRIPTION OF THE DRAWINGS

Various exemplary embodiments of the solution according to the invention are explained in greater detail below with reference to the drawings. Elements which are identical, of identical type or act identically are provided with the same reference signs in the Figures. The Figures and the size relationships of the elements illustrated in the Figures among one another should not be regarded as to scale. Rather, individual elements may be illustrated with an exaggerated size or reduction in size in order to enable better illustration and in order to afford a better understanding.

FIG. 1b shows in plan view roughly schematically the exemplary embodiment from FIG. 1a;

DETAILED DESCRIPTION OF ILLUSTRATIVE EMBODIMENTS

Figure 1A:
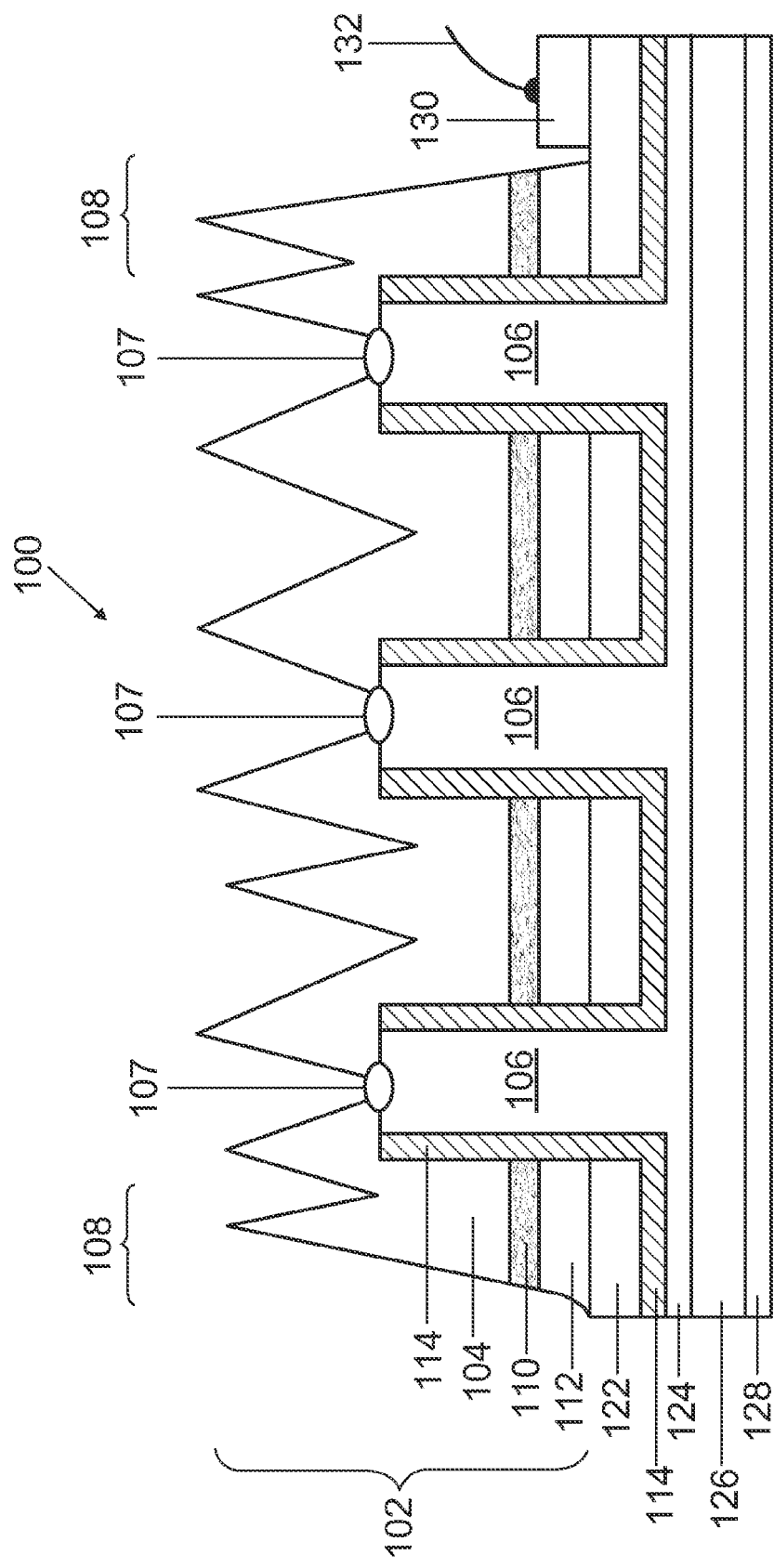
FIG. 1a shows in sectional view an exemplary embodiment of an optoelectronic semiconductor chip.

Various embodiments of an optoelectronic semiconductor chip comprise an epitaxial layer sequence. The epitaxial layer sequence comprises a doped epitaxial layer. The doped epitaxial layer comprises a first region and a second region. The epitaxial layer sequence comprises a protected structure. The first region of the doped epitaxial layer completely covers the protected structure. An outer surface of the doped epitaxial layer comprises a first roughness in the first region and a second roughness in the second region. This arrangement ensures that protected structures are not exposed and that at the same time a high coupling-out efficiency for the electromagnetic radiation generated in the epitaxial layer sequence is achieved.

The epitaxial layer sequence can be based on a GaN or InGaN layer system. An active zone is provided in the epitaxial layer sequence. The active zone emits electromagnetic radiation which can be coupled out from the semiconductor chip. The emission spectrum is preferably in the green to ultraviolet, particularly preferably in the blue spectral range. However, the emission spectrum can also be in the red to yellow spectral range.

The thickness of the epitaxial layer sequence is typically between 1 µm and 20 µm.

Roughness is a term in surface physics and denotes the unevenness of the surface height. The surface roughness can be influenced for example by polishing, grinding, etching or by corrosion. There are a number of roughness specifications, all of which are specified in the unit µm.

The first roughness of the outer surface of the doped epitaxial layer can be formed by, in particular hole-shaped, depressions having depths of less than 0.5 µm. These structures can arise, for example, during a laser lift-off. During the laser lift-off, by means of irradiation by a laser, a substrate can be separated from the epitaxial layer sequence that had previously been grown onto the substrate. Additionally, or alternatively, the first roughness can also be formed by voids and surface defects on the outer surface of the doped epitaxial layer. Structures such as hole-shaped depressions, voids or surface defects are only of little relevance to the coupling-out of light.

In one preferred embodiment, the first region of the outer surface of the doped epitaxial layer is covered by a protective mask. The protective mask is intended to cover regions of the doped epitaxial layer which are not intended to be roughened further during a roughening process. In one preferred embodiment, the protective mask can remain on the doped epitaxial layer after the roughening process. The protective mask can comprise silicon nitride (SiN) or silicon dioxide ($SiO_2$). Silicon dioxide is particular advantageous. In contrast to silicon nitride, silicon dioxide hardly absorbs electromagnetic radiation in the blue and green spectral range. In the red spectral range, by contrast, both silicon nitride and silicon dioxide are only weakly absorbent, for which reason both materials are used in active zones which emit electromagnetic radiation in the red spectral range.

In an alternative advantageous embodiment, the first region of the outer surface of the doped epitaxial layer is not covered, that is to say that no protective mask is arranged on the first region. This is achieved by the protective mask being removed after the roughening process. This is advantageous since no chemicals used for roughening the outer surface of the doped epitaxial layer can form residues at the protective mask. In addition, the problem of light absorption in the protective mask is avoided.

In one preferred embodiment, the first roughness of the first region, which covers the contact recesses, is formed by pyramidal depressions having etching depths of up to 1 µm. This is advantageous since electromagnetic radiation can thereby be coupled out efficiently from the epitaxial layer sequence above the protected structures as well. The etching depth of a maximum of 1 µm ensures that no protected structures are exposed. In the present application, the roughness is specified in the average step height which is produced by the etched pyramidal depressions.

In one preferred embodiment, the second roughness on the second region is formed by pyramidal depressions having etching depths of 0.5 µm to 4 µm. The side faces of the pyramidal depressions form angle of 35° to 75°, preferably of 50° to 70°, with the plane of the epitaxial layer sequence. The respective angle is predefined by the crystal direction and the chemical removal. The combination of etching depth in the µm range with an angle between 35° and 75° is particularly advantageous since, as a result, a particularly large proportion of electromagnetic radiation can be coupled out from the epitaxial layer sequence. This stems from the fact that the greater the etching depths, the larger the pyramids that are produced. The larger the pyramids, the more light can be coupled out. This relationship holds true only if the emitted electromagnetic radiation, in the medium of the epitaxial layer sequence, has a smaller wavelength than the diameter of the base of the pyramids. By way of example, the epitaxial layer sequence can be based on a GaN system. Given a wavelength of the electromagnetic radiation of approximately 0.4 µm, the refractive index of GaN is approximately 2.5. The wavelength of the electromagnetic radiation in the medium is therefore approximately 0.16 µm. Pyramids having a diameter of the base of more than approximately 0.16 µm can couple out the electromagnetic radiation.

In one preferred embodiment, the protected structures comprise a plurality of contact recesses. The contact recesses traverse the epitaxial layer sequence parallel to the growth direction thereof and produce the electrical contact with the doped epitaxial layer. This is advantageous since the doped epitaxial layer can be energized without light emitted from the active zone of the epitaxial layer sequence being shaded. This stems from the fact that electrical contact structures are no longer necessary on the outer surface of the doped epitaxial layer.

In one preferred embodiment, the doped epitaxial layer is an n-doped layer. The n-doped layer is connected to an n-type contact of the optoelectronic semiconductor chip by means of electrically conductive contact recesses.

In one preferred embodiment, the protected structures have the circumferential edge of the epitaxial layer sequence. This is particularly advantageous since the circumferential edge is protected from the etching chemicals used for the roughening. Consequently, the circumferential edge has a clearly defined form, a good structure fidelity and a minimum length. A smooth edge is essential for the process step of automatic inspection of the optoelectronic semiconductor chip. The protected circumferential edge of the epitaxial layer sequence is also helpful when etching the mesa edge using phosphoric acid. A passivation composed of $SiO_2$ can cover the doped epitaxial layer. The main purpose of the passivation is to cover the mesa edge in order to avoid a short circuit. The protection of the circumferential edge has the effect that the phosphoric acid can undercut or creep under the $SiO_2$ passivation to a lesser extent. Consequently, fewer holes arise in the doped epitaxial layer. Advantageously, it is possible to etch through the entire epitaxial layer sequence at the edge using phosphoric acid without affecting the doped epitaxial layer.

Various embodiments comprise a method for producing an optoelectronic semiconductor chip. Firstly, an epitaxial layer sequence is provided. The epitaxial layer sequence was grown onto a substrate, in particular silicon carbide (SiC), silicon (Si) or sapphire ($Al_2O_3$). That area of the epitaxial layer sequence which faces away from the substrate was bonded onto a carrier, in particular comprising germanium. The epitaxial layer sequence was subsequently separated from the substrate by irradiation of laser radiation (laser lift-off). The epitaxial layer sequence comprises a doped epitaxial layer having an outer surface. A structured protective mask is subsequently applied to the outer surface. The doped epitaxial layer is subsequently etched. Potassium hydroxide (KOH) can be used as etchant. In this case, a first region having a first roughness remains on that region of the outer layer which is covered by the protective mask. This is advantageous since the epitaxial layer sequence is not thinned in the first region. Firstly, this prevents undesirable exposure of protected structures. Secondly, the epitaxial layer sequence can be designed to be thinner before etching. Although the etching of thinner epitaxial layer sequences generally produces pyramids of lesser depth, this reduces the necessary amount of expensive epitaxial layer material. A second region having a second roughness is produced on that region of the outer surface which is not covered by the protective mask. This is advantageous since etching depths in the µm range are produced in the second region. These etching depths are a prerequisite for the formation of pyramids which enable electromagnetic radiation to be coupled out efficiently. It is particularly advantageous that the roughening times are significantly longer in comparison with methods which carry out etching without a protective mask. As a result, greater etching depths and thus larger pyramids can be achieved. This is advantageous since, as a result, more light can be coupled out through the pyramids.

In one preferred embodiment, the protective mask is applied on the outer surface above a plurality of contact recesses. As mentioned above, this is advantageous since the contact recesses are not exposed in an undesired manner during the etching step.

In one preferred embodiment, the protective mask is applied on the circumferential edge of the epitaxial layer sequence. This is advantageous since, as a result, during the etching of the mesa edge using phosphoric acid, the mesa edge is protected.

In one preferred embodiment, after the doped epitaxial layer has been etched using KOH, the protective mask is removed from the first region. This is advantageous since, as a result, the first region of the outer surface can subsequently be etched. This increases the coupling-out efficiency for the electromagnetic radiation generated in the epitaxial layer sequence.

Further details will now be provided with reference to the drawings.

FIG. 1a shows in sectional view an exemplary embodiment of an optoelectronic semiconductor chip 100 without protected regions. An epitaxial layer sequence 102 comprising a doped epitaxial layer 104, comprising an active zone 110 and comprising a further doped epitaxial layer 112 is arranged on a current spreading layer 122. The current spreading layer 122 comprises a mirror comprising silver and an encapsulation of the silver mirror. The encapsulation material comprises gold. The current spreading layer 122 is arranged on an electrically insulating passivation 114. There follows thereon an electrically conductive material 124 comprising silver. There follows thereupon an electrically conductive carrier 126, for example composed of germanium.

A first contact 128 is applied on that side of the carrier 126 which faces away from the epitaxial layer sequence. Contact recesses 106 are arranged through the epitaxial layer sequence 102. The contact recesses 106 realize the electrical connection of the first contact 128 to the doped epitaxial layer 104. For this purpose, the contact recesses 106 are filled with the electrically conductive material 124 and insulated from the further doped epitaxial layer 112 by the passivation 114. A second contact 130 produces the electrical contact with the further doped epitaxial layer 112 via the current spreading layer 122.

The doped epitaxial layer 104 comprises pyramidal depressions reaching as far as the contact recesses 106. This results in exposed regions 107 of the electrically conductive material 124 on the contact recesses 106. As a result, the electrically conductive material 124 comprising silver in the contact recesses 106 is at least partly exposed. The exposed silver can effect electromigration. As a result, the optoelectronic semiconductor chip 100 becomes unusable for further process steps.

The circumferential edge 108 of the epitaxial layer sequence 102 likewise comprises depressions which, although they do not make the optoelectronic semiconductor chip 100 unusable, make the automatic inspection of the optoelectronic semiconductor chip 100 more difficult. In addition, the mesa edge of the optoelectronic semiconductor chip is hardly protected, which increases the probability of failure of the semiconductor chip.

Figure 1B:
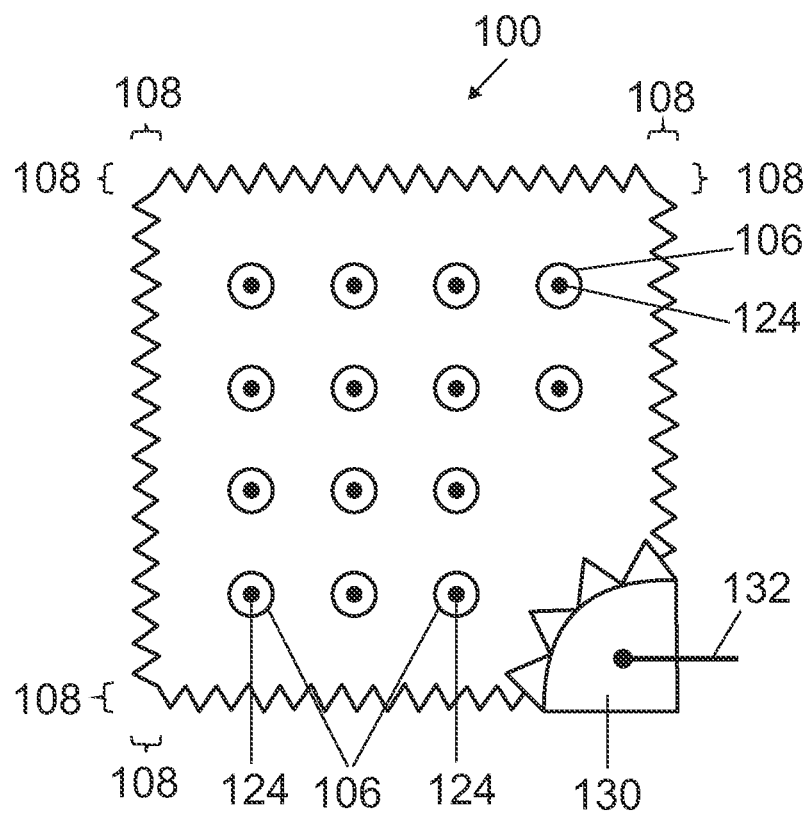

FIG. 1b shows in plan view roughly schematically the exemplary embodiment from FIG. 1a. The contact recesses 106 can be discerned. The electrically conductive material 124 is exposed. The optoelectronic semiconductor chip 100 is therefore unusable. In addition, the circumferential edge 108 of the epitaxial layer sequence 102 has a fringed structure. This gives rise to a very extensive edge 108 of the optoelectronic semiconductor chip 100. This increases the probability of failure of the optoelectronic semiconductor chip 100.

Figure 2A:
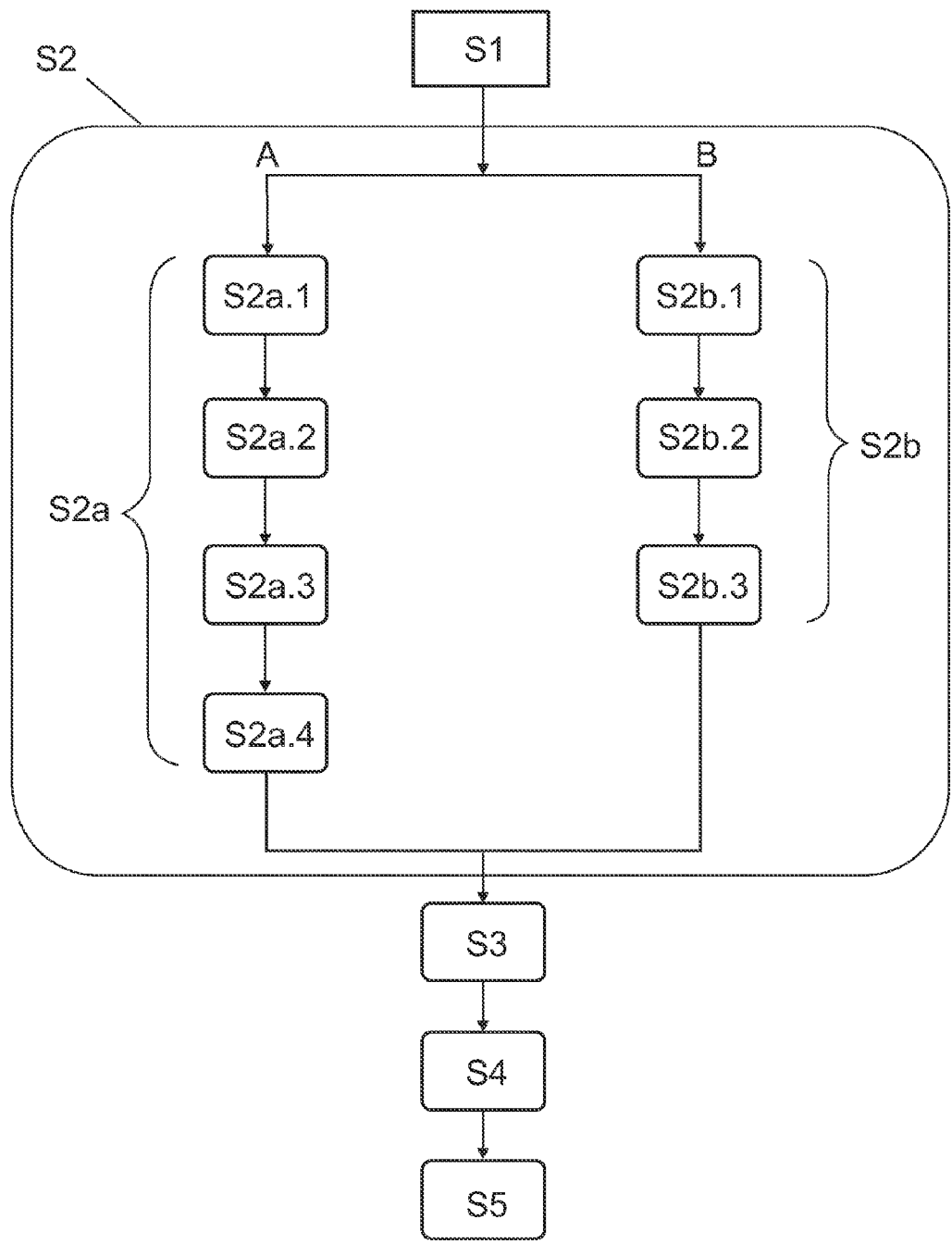
FIG. 2a shows a flowchart for producing an optoelectronic semiconductor chip.

FIG. 2a shows a flow chart of two alternative production methods A and B, respectively, for an optoelectronic semiconductor chip. The production process can be subdivided into steps S1 to S5. Steps S4 and S5 are optional.

Figure 2B:
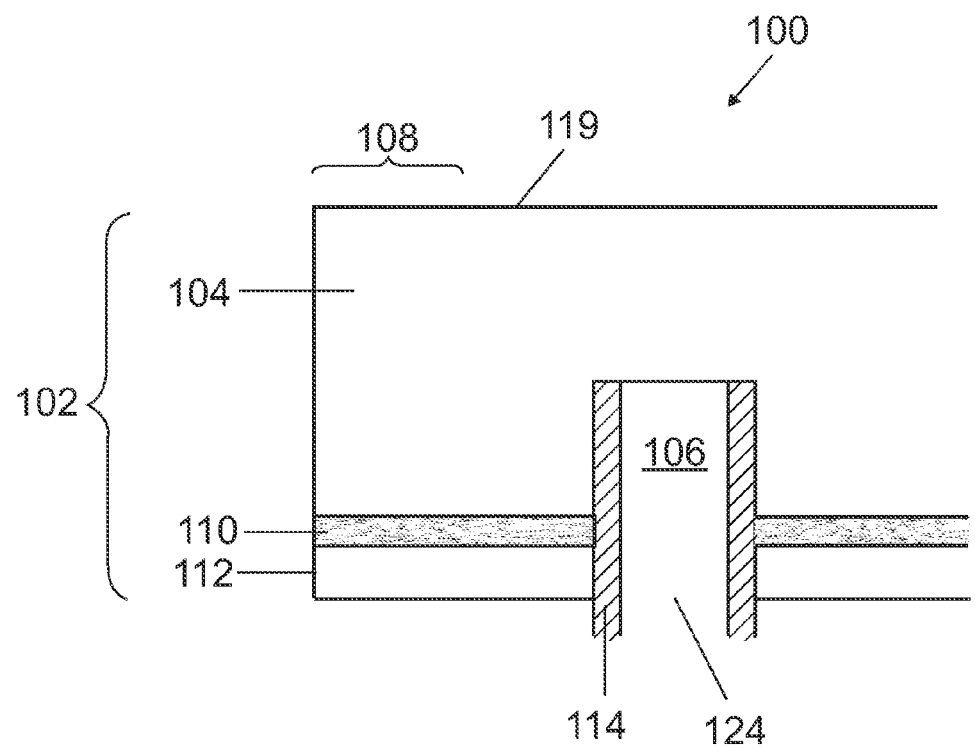
FIGS. 2b and 2c show excerpts in sectional view from intermediate products of the method for producing an optoelectronic semiconductor chip.

In step S1, an epitaxial layer sequence 102 is provided. FIG. 2b shows the result of step S1. The doped epitaxial layer 104 having an outer surface 119 is followed by the active zone 110. The active zone 110 is followed by the further doped epitaxial layer 112. A contact recess 106 completely traverses the further doped epitaxial layer 112 and the active zone 110 and ends in the doped epitaxial layer 104. The contact recess 106 is filled with electrically conductive material 124. An insulating passivation 114 is arranged between the contact recess 106 and the epitaxial layer sequence 102. The outer surface 119 of the doped epitaxial layer 104 has a first roughness, which is not illustrated graphically. The first roughness is formed by in particular hole-shaped depressions having depths of up to approximately 0.5 µm. These structures can arise during laser lift-off, during which the growth substrate is separated from the epitaxial layer sequence 102 by irradiation of a laser. Alternatively or additionally, the first roughness can also be formed by voids and surface defects on the outer surface 119 of the doped epitaxial layer 104. Owing to its small depth, this first roughness is hardly relevant to the coupling-out of light. Therefore, the first roughness is not illustrated in FIG. 2b.

In step S2, a protective mask 120 is applied. FIG. 2a shows two alternative ways, S2a and S2b, for performing method step S2. Both ways lead to the same intermediate product shown in FIG. 2c.

Alternative S2a is subdivided into the following sub-steps: in sub-step S2a.1, a protective layer is applied to the doped epitaxial layer 104 over the whole area. In sub-step S2a.2, photoresist is applied to the regions of the doped epitaxial layer 104 which are to be protected, that is to say over the circumferential edge 108 and over the contact recesses 106. In sub-step S2a.3, the regions of the protective layer which are not covered by photoresist are removed. In sub-step S2a.4, the photoresist is removed.

Alternative S2b is subdivided into the following sub-steps: in sub-step S2b.1, photoresist is applied in a structured fashion to the doped epitaxial layer 104 with omission of the regions to be protected. In sub-step S2b.2, a protective layer is applied to doped epitaxial layer 104 over the whole area. In sub-step S2b.3, the photoresist is lifted off.

Figure 2C:
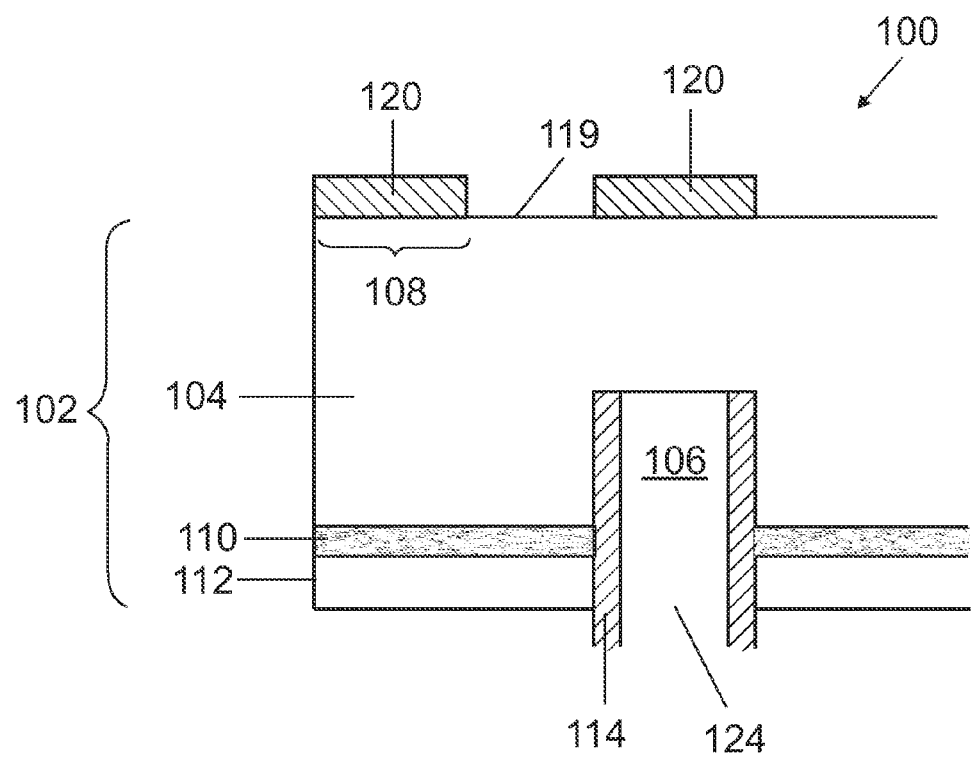

FIG. 2c shows an excerpt from the intermediate product in sectional view after the conclusion of step S2. Above the protected structure 106, 108, the protective mask 120 is applied on the outer surface 119 of the doped epitaxial layer 104. The protective mask can comprise SiN or $SiO_2$.

In step S3, the doped epitaxial layer 104 is etched. A first region 116 having a first roughness remains on the outer surface 119 of the doped epitaxial layer 104 which is covered by the protective mask 120. A second region 118 having a second roughness is produced on that region of the outer surface 119 of the doped epitaxial layer 104 which is not covered by the protective mask 120.

Figure 2D:
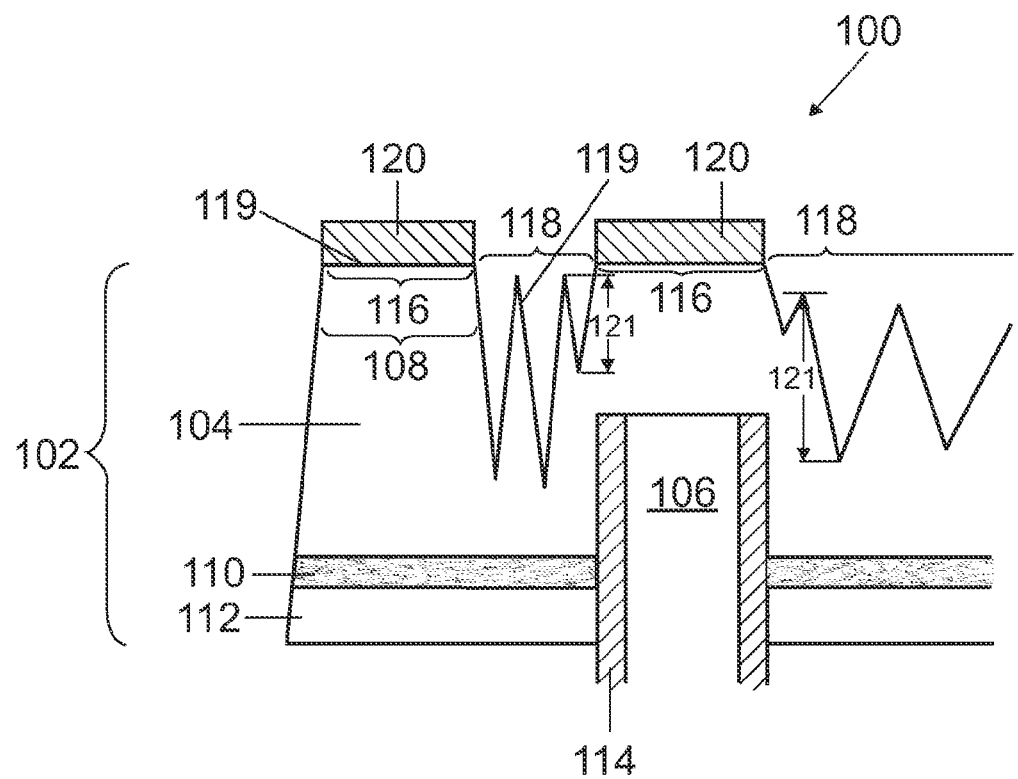
FIGS. 2d, 2e and 2f show excerpts from sectional views of optoelectronic semiconductor chips.

FIG. 2d shows an excerpt from sectional views of the optoelectronic semiconductor chip 100 after the conclusion of step S3. The first region 116 of the outer surface 119 is covered by a protective mask 120. The second region 118 of the outer surface 119 has a second roughness comprising pyramidal depressions. Etching depths of between 0.5 µm and 4 µm are formed. The etching depths are represented as step heights 121 of the second region 118. The protected structure comprises an electrically conductive contact recess 106. The contact recess 106 traverses the epitaxial layer sequence 102 parallel to the growth direction thereof. The contact recess 106 produces the electrical contact with the doped epitaxial layer 104. The doped epitaxial layer 104 can be n-doped. The protected structure additionally comprises a circumferential edge 108 of the epitaxial layer sequence 102.

In optional step S4, the protective mask 120 is removed. The protective mask 120 composed of $SiO_2$ or SiN can be removed by an etching process using hydrofluoric acid (HF) or ammonia-buffered hydrofluoric acid (BOE).

Figure 2E:
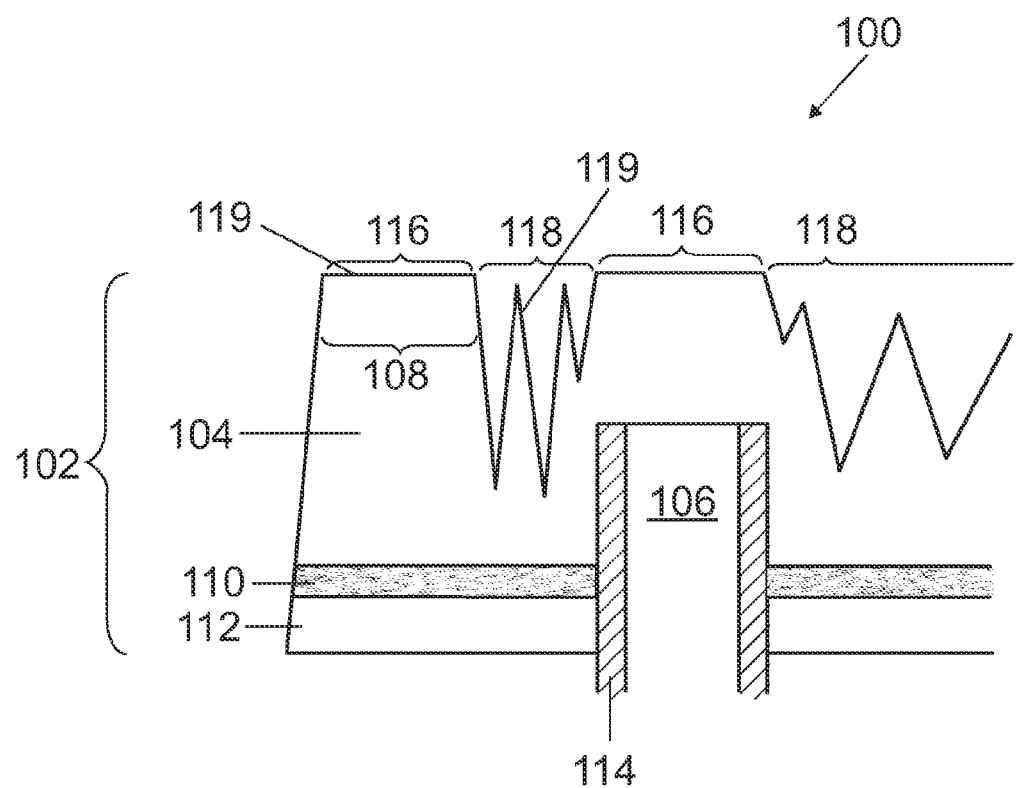

FIG. 2e shows an excerpt from a sectional view of the optoelectronic semiconductor chip 100 after the conclusion of step S4. FIG. 2e differs from FIG. 2d merely in that the protective mask 120 is removed. The first region 116 of the outer surface 119 of the doped epitaxial layer 104 is now exposed.

In step S5, after the protective mask 120 has been removed, the first region 116 of the doped epitaxial layer 104 is subsequently etched using KOH.

Figure 2F:
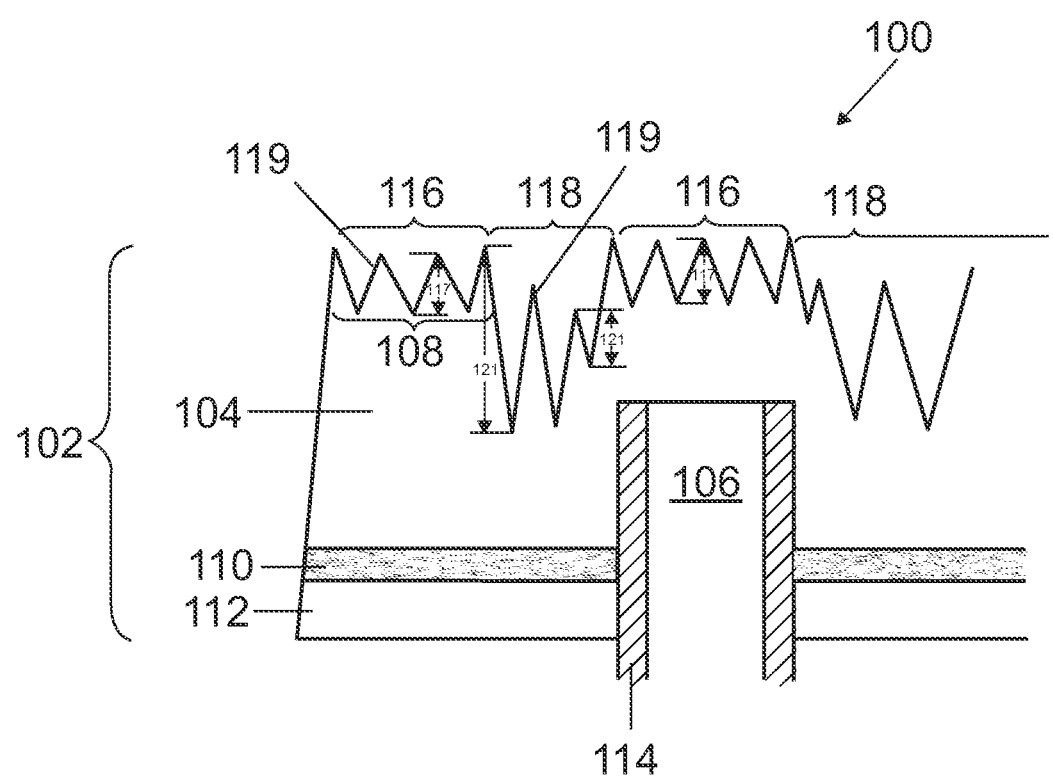

FIG. 2f shows an excerpt from a sectional view of the optoelectronic semiconductor chip 100 after the conclusion of step S5. The first roughness on the first region 116 of the outer surface 119 of the doped epitaxial layer 104 comprises pyramidal depressions having etching depths of up to 1 μm. As a result, light can also be coupled out efficiently from regions of the doped epitaxial layer 104 which are arranged above the contact recess 106 and/or above the circumferential edge 108 of the epitaxial layer sequence 102. The etching depths are represented as step height 117 of the first region 116 and as step height 121 of the second region 118. The step height 117 of the first region 116, in other words the etching depth, is up to 1 μm. The step height 121 of the second region 118, in other words the etching depth, is between approximately 0.5 μm and approximately 4 μm.

Figure 3:
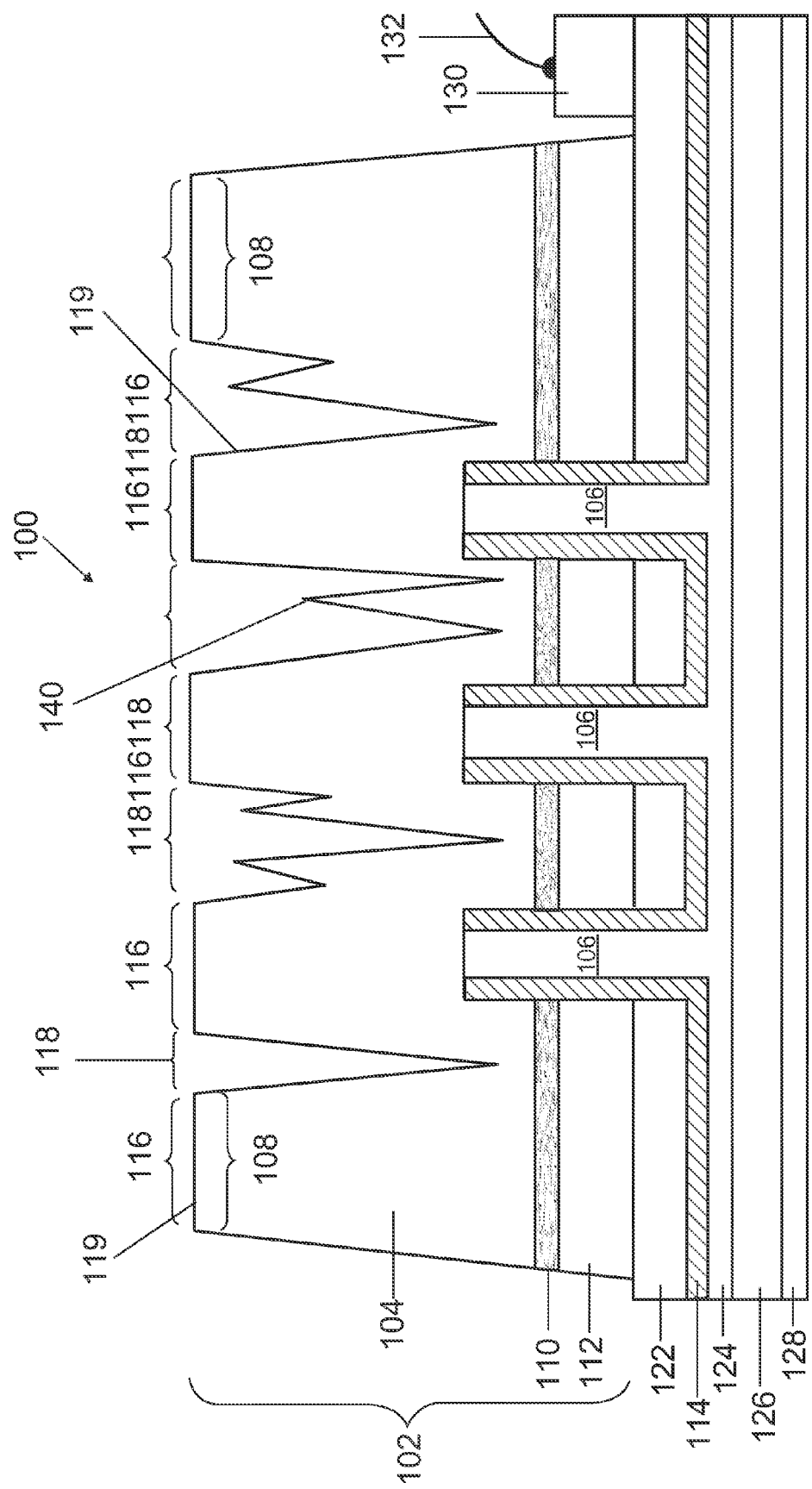
FIG. 3 shows in sectional view an exemplary embodiment of an optoelectronic semiconductor chip.

FIG. 3 shows in sectional view an exemplary embodiment of an optoelectronic semiconductor chip 100. The illustration shows the entire optoelectronic semiconductor chip 100 based on the epitaxial layer sequence 102 illustrated in FIG. 2e. The contact recesses 106 and the circumferential edge 108 of the epitaxial layer sequence 102 are completely covered by the doped epitaxial layer 104. The first region 116 of the outer surface 119 has a first roughness comprising depressions of up to 0.5 μm. For the sake of clarity, the first roughness is not illustrated graphically. The second region 118 of the outer surface 119 has a second roughness comprising depressions in the form of pyramids 140. The pyramids 140 have a height of up to 4 μm. A first contact 128 makes contact with electrically conductive material 124 via a carrier 126. The electrically conductive material 124 produces the electrical connection to the doped epitaxial layer 104 via the contact recesses 106. A further doped epitaxial layer 112 is electrically connected to a second contact 130 via a current spreading layer 122.

Figure 4A:
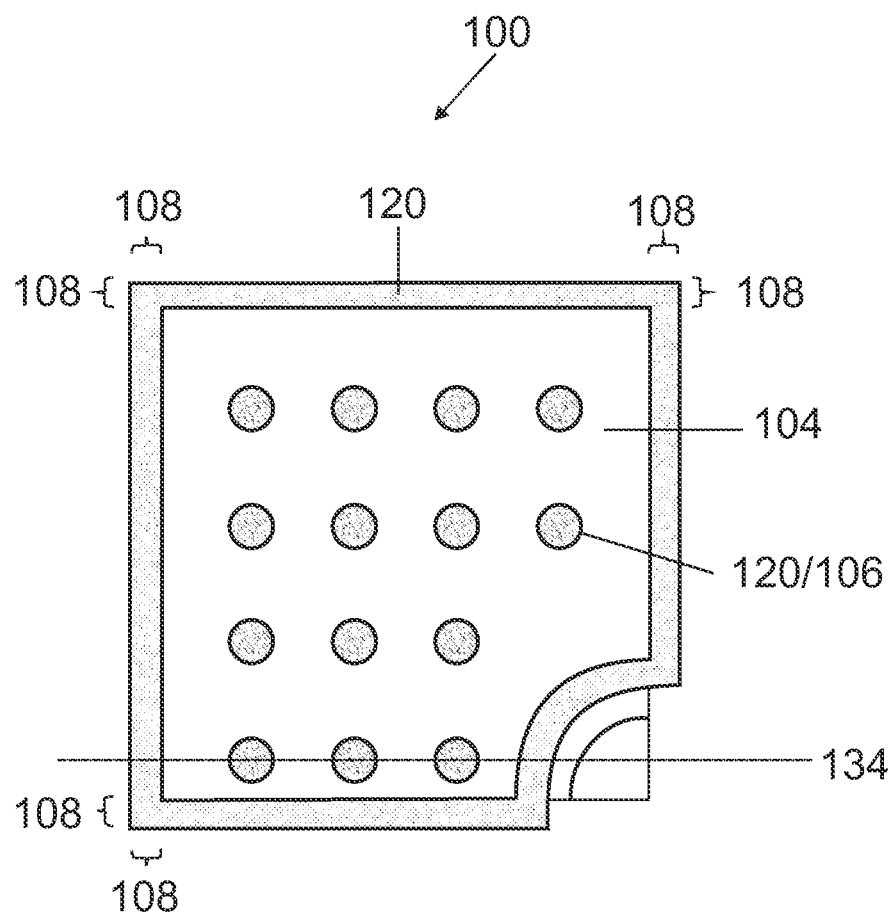
FIG. 4a shows in plan view an exemplary embodiment of an optoelectronic semiconductor chip.

FIG. 4a shows in plan view an exemplary embodiment of an optoelectronic semiconductor chip. The circumferential edge 108 of the epitaxial layer sequence 102 and the regions of the doped epitaxial layer 104 which completely cover the contact recesses 106 are covered with a protective mask 120. A sectional line 134 is depicted along which the exemplary embodiment from FIG. 4b is illustrated.

Figure 4B:
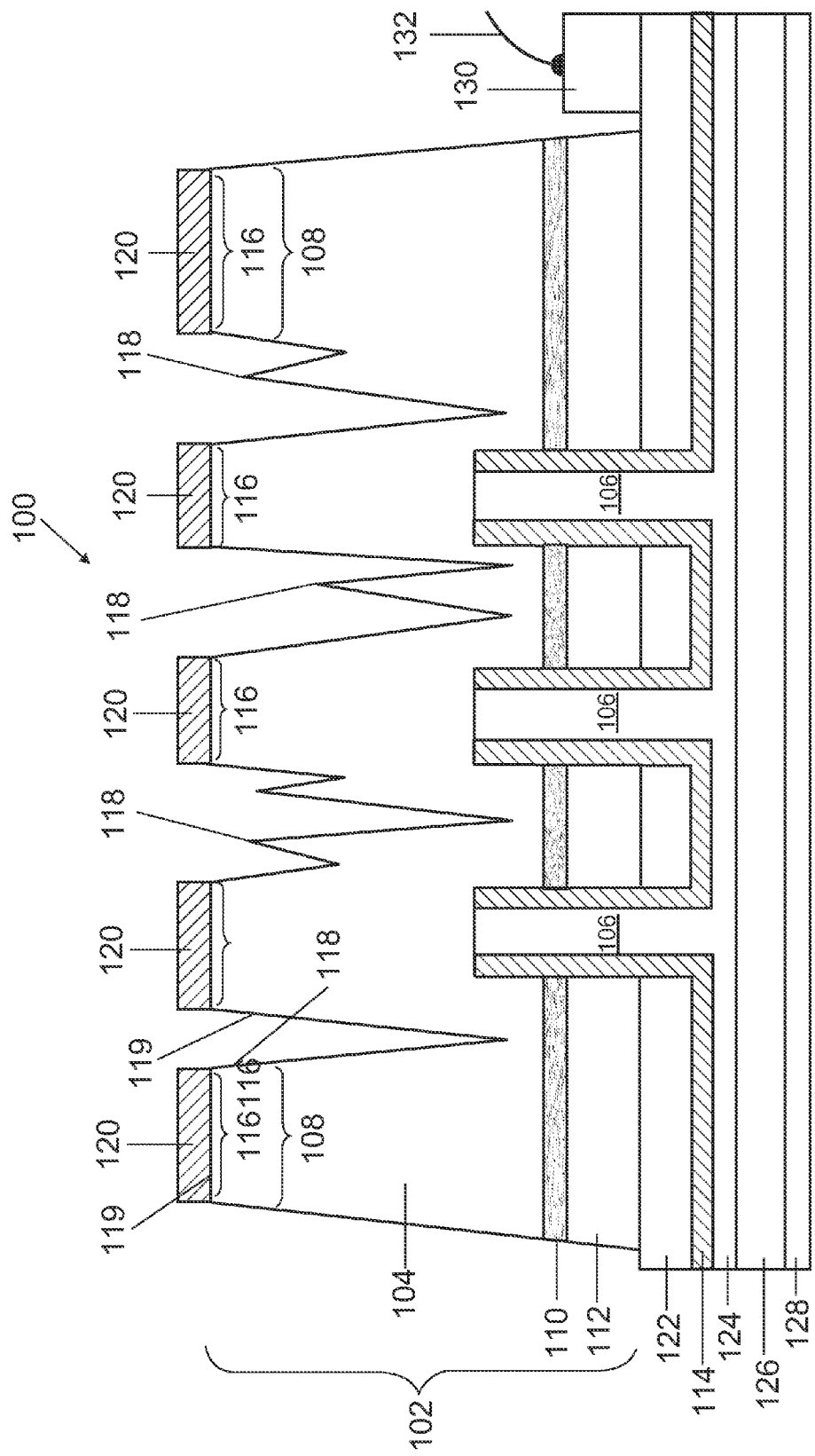
FIG. 4b shows in sectional view an exemplary embodiment of an optoelectronic semiconductor chip.

FIG. 4b shows in sectional view an exemplary embodiment of an optoelectronic semiconductor chip. The exemplary embodiment from FIG. 4b differs from the exemplary embodiment from FIG. 3 solely in that the protective mask 120 covers the first region 116 of the outer surface 119.

Figure 5:
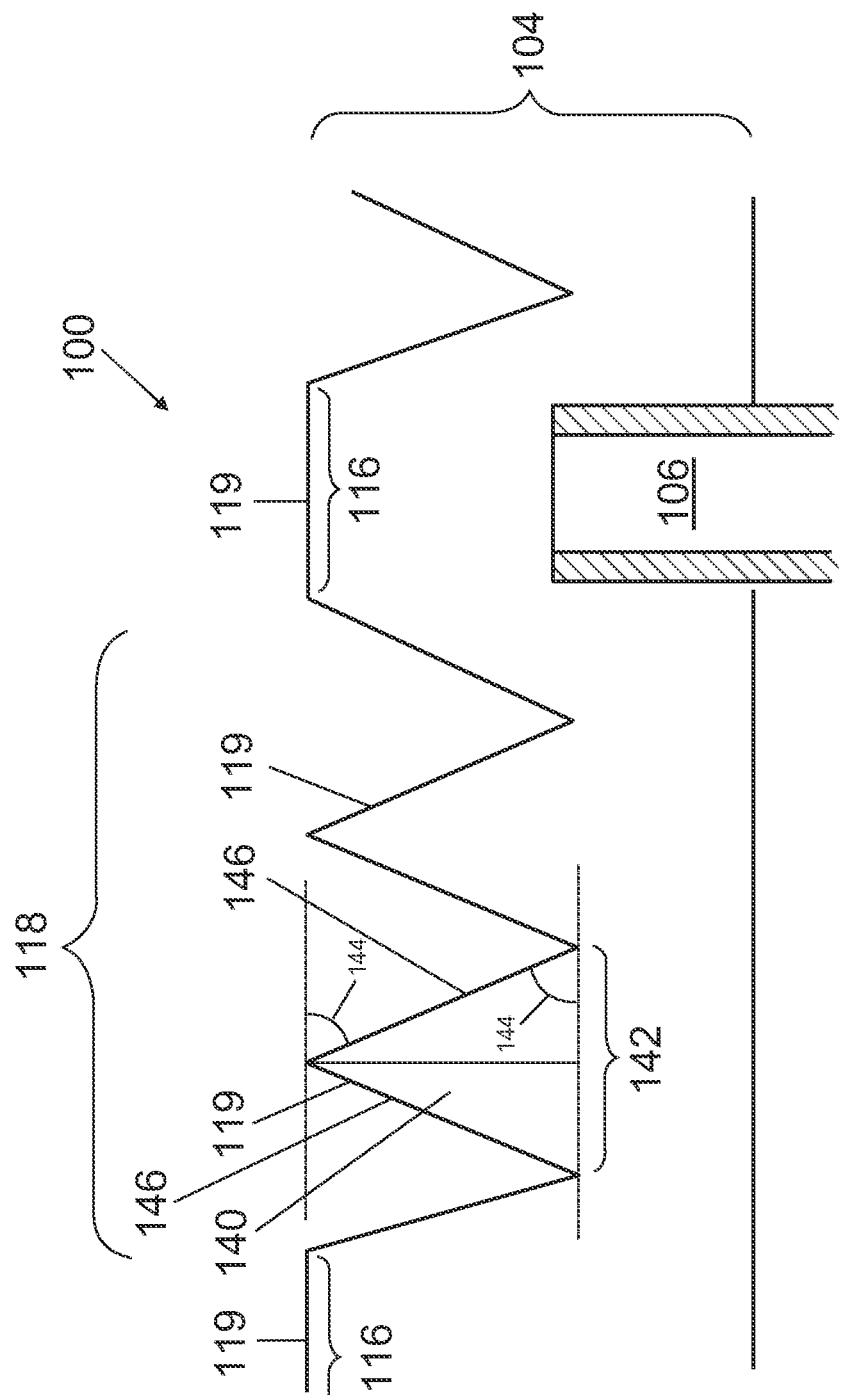
FIG. 5 shows pyramids in the doped epitaxial layer of the epitaxial layer sequence.

FIG. 5 shows a partly roughened doped epitaxial layer 104. A contact recess 106, a virtually non-roughened first region 116 of the outer surface 119 above the contact recess 106 and a roughened second region 118 of the outer surface 119 are shown by way of example. In the second region 118 of the outer surface 119, one pyramid 140 from the multiplicity of pyramids of the partly roughened doped epitaxial layer 104 is shown by way of example. The outer surface 119 of the doped epitaxial layer 104 forms the interface between the optically denser medium of the optoelectronic semiconductor chip 100 in particular comprising GaN and the optically less dense medium air. The proportion of electromagnetic radiation which is totally reflected at the outer surface 119 is reduced by the pyramidal depressions.

The side faces 146 of the pyramidal depressions form an angle of 35° to 75°, preferably of 50° to 70°, with the plane of the epitaxial layer sequence 102. The concrete angle 144 is predefined by the crystal direction of the doped epitaxial layer 104 and the chemical removal. Given an etching depth in the μm range and given angles 144 from the above range of values, pyramids arise which are particularly suitable for coupling out electromagnetic radiation in the visible wavelength range, that is to say at wavelengths of between approximately 0.3 μm and approximately 0.8 μm. The diameter 142 of the base of a pyramid 140 is likewise in the μm range. The diameter 142 is thus significantly greater than the wavelength of the electromagnetic radiation in the semiconductor medium.

By way of example, electromagnetic radiation having a wavelength of approximately 450 nm in air has a wavelength of approximately 200 nm in a medium composed of GaN with a refractive index of approximately 2.4. The ratio of 2 to 10 between diameter 142 of the base of the pyramid 140 and wavelength of the electromagnetic radiation in the medium is the necessary prerequisite for enabling electromagnetic radiation to couple from the doped epitaxial layer 104 into a pyramid 140. The base of the pyramid 140 has a hexagonal form in the case of GaN.

Figure 6A:
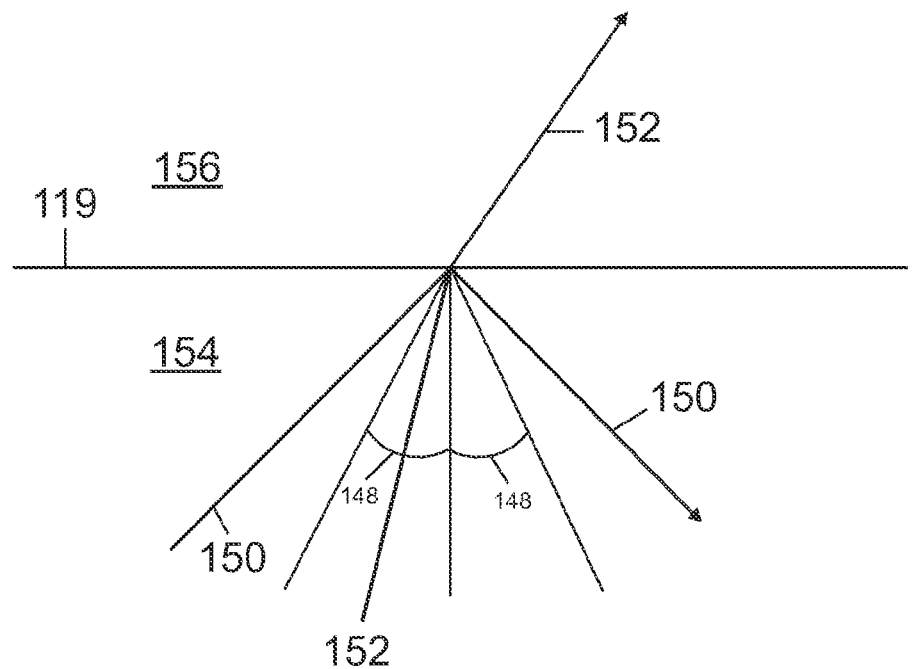
FIG. 6a shows the angular range in which light can leave a medium.

FIG. 6a shows the angular range in which no total reflection of light rays 152 occurs at an outer surface 119. Light rays 152 which impinge on the outer surface 119 of the doped epitaxial layer 104 at an angle less than the critical angle 148 are refracted at the transition from the optically denser medium 154 to the optically less dense medium 156. These light rays 152 can leave the optically denser medium 154. By contrast, light rays 150 which impinge on the outer surface 119 at an angle that is greater than the critical angle 148 are totally reflected.

Given a doped epitaxial layer 104 as optically denser medium 154 composed of a GaN system with a refractive index of approximately 2.4 and an optically less dense medium 156 composed of air with a refractive index of 1, a critical angle 148 of approximately 25° results. The angular range in which the light can leave the optically denser medium 154 is called "escape cone."

Figure 6B:
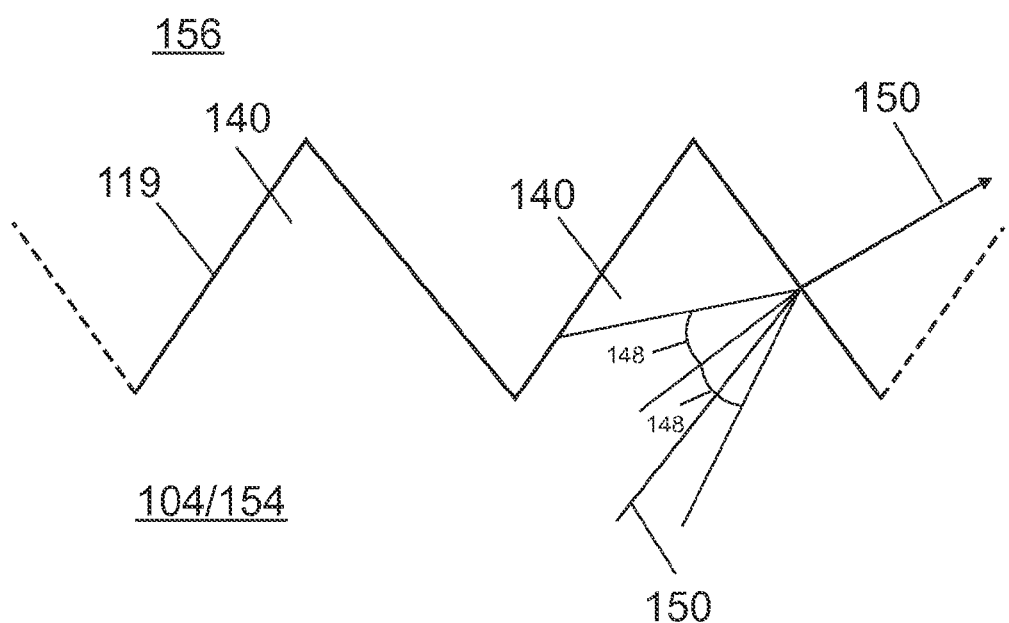
FIG. 6b shows a pyramid structure from which light emerges.

FIG. 6b shows the outer surface 119 of the doped epitaxial layer 104, which forms the optically denser medium 154, with a structure composed of pyramids 140. As a result of the pyramid structure, the first light ray 150 now impinges on the outer surface 119 within the critical angle 148 of total reflection. The first light ray 150 is no longer totally reflected and emerges from the doped epitaxial layer 104 and thus from the optoelectronic semiconductor chip 100. Overall, more light emerges from the pyramidally roughened outer surface 119 than if the outer surface 119 were approximately planar.

The invention claimed is:
1. An optoelectronic semiconductor chip comprising:
an epitaxial layer sequence comprising a doped epitaxial layer comprising a first region and a second region and a protected structure,
wherein the first region of the doped epitaxial layer completely covers the protected structure, and wherein an outer surface of the doped epitaxial layer has a first roughness in the first region and a second roughness in the second region.

2. The optoelectronic semiconductor chip according to claim 1, wherein the first roughness is formed by depressions having depths of less than approximately 0.5 µm, voids and surface defects.

3. The optoelectronic semiconductor chip according to claim 2, wherein the depressions comprise hole-shaped depressions.

4. The optoelectronic semiconductor chip according to claim 1, wherein the first roughness is formed by pyramidal depressions having etching depths of up to approximately 1 µm.

5. The optoelectronic semiconductor chip according to claim 1, wherein the second roughness is formed by pyramidal depressions having etching depths of approximately 0.5 µm to approximately 4 µm.

6. The optoelectronic semiconductor chip according to claim 5, wherein the first roughness is formed by pyramidal depressions having etching depths of up to approximately 1 µm.

7. The optoelectronic semiconductor chip according to claim 1, wherein at least one of the first roughness and the second roughness is formed by pyramidal depressions having side faces, which form an angle of 35° to 75° with a plane of the epitaxial layer sequence.

8. The optoelectronic semiconductor chip according to claim 7, wherein the side faces form an angle of 50° to 70° with the plane of the epitaxial layer sequence.

9. The optoelectronic semiconductor chip according to claim 1, wherein the protected structure comprises at least one contact recess that traverses the epitaxial layer sequence parallel to a growth direction thereof and produces an electrical contact with the doped epitaxial layer.

10. The optoelectronic semiconductor chip according to claim 1, wherein the protected structure comprises a circumferential edge of the epitaxial layer sequence.

11. The optoelectronic semiconductor chip according to claim 1, wherein the doped epitaxial layer is n-doped.

12. The optoelectronic semiconductor chip according to claim 1, wherein the first region is covered by a protective mask.

13. The optoelectronic semiconductor chip according to claim 1, wherein the optoelectronic semiconductor chip further comprises a protective mask, wherein the protective mask is applied on the outer surface above the protected structure.

14. The optoelectronic semiconductor chip according to claim 1, wherein the optoelectronic semiconductor chip comprises a multiplicity of first regions, a multiplicity of second regions, and a multiplicity of protected structures, wherein each first region is assigned to a protected structure in a one-to-one manner.

15. The optoelectronic semiconductor chip according to claim 14, wherein each first region is laterally enclosed by second regions.

16. A method for producing an optoelectronic semiconductor chip, the method comprising:
   providing an epitaxial layer sequence comprising a doped epitaxial layer having an outer surface;
   applying a structured protective mask to the outer surface; and
   etching the doped epitaxial layer, wherein the protective mask is applied on the outer surface above the at least one contact recess, wherein a first region having a first roughness remains on the outer surface covered by the protective mask, and wherein a second region having a second roughness is produced on that region of the outer surface which is not covered by the protective mask.

17. The method according to claim 16, wherein the protective mask is applied on the outer surface above a circumferential edge of the epitaxial layer sequence.

18. The method according to claim 16, further comprising removing the protective mask after the doped epitaxial layer has been etched.

19. The method according to claim 18, further comprising etching the first region of the doped epitaxial layer after the protective mask has been removed.

20. The method according to claim 16, wherein the protective mask remains on the doped epitaxial layer after etching.

21. An optoelectronic semiconductor chip comprising:
   an epitaxial layer sequence comprising a doped epitaxial layer comprising a first region and a second region and a protected structure,
   wherein the first region of the doped epitaxial layer completely covers the protected structure,
   wherein an outer surface of the doped epitaxial layer has a first roughness in the first region and a second roughness in the second region,
   wherein the doped epitaxial layer has a first average thickness in the first region,
   wherein second roughness of the second region is formed by depressions in the epitaxial layer, and
   wherein at least one depression has a step height parallel to a growth direction greater than the first average thickness.

22. The optoelectronic semiconductor chip according to claim 21, wherein at least one depression of the second region in a direction parallel to the growth direction extends as far as the protected structure.

* * * * *